United States Patent
Nautiyal et al.

(10) Patent No.: US 6,894,541 B2
(45) Date of Patent: May 17, 2005

(54) SENSE AMPLIFIER WITH FEEDBACK-CONTROLLED BITLINE ACCESS

(75) Inventors: Vivek Nautiyal, Balasaur Kotdwara (IN); Ashish Kumar, Ranchi (IN)

(73) Assignee: STMicroelectronics Pvt. Ltd. (IN)

( * ) Notice: Subject to any disclaimer, the term of this patent is extended or adjusted under 35 U.S.C. 154(b) by 0 days.

(21) Appl. No.: 10/684,076

(22) Filed: Oct. 10, 2003

(65) Prior Publication Data

US 2004/0130353 A1 Jul. 8, 2004

(30) Foreign Application Priority Data

Oct. 16, 2002 (IN) ........................................ 1039/Del/02

(51) Int. Cl.[7] .............................................. G01R 15/00
(52) U.S. Cl. ............................ 327/55; 327/54; 327/57
(58) Field of Search ............................. 327/51, 52, 54, 327/55, 57; 365/203, 205, 207

(56) References Cited

U.S. PATENT DOCUMENTS

| | | | | | |
|---|---|---|---|---|---|
| 5,552,728 A | * | 9/1996 | Lin | ............................. | 327/57 |
| 5,615,161 A | * | 3/1997 | Mu | ............................. | 365/208 |
| 5,796,273 A | * | 8/1998 | Jung et al. | .................... | 327/57 |
| 5,939,903 A | * | 8/1999 | Lin | ............................. | 327/57 |
| 6,584,026 B2 | * | 6/2003 | Kawasumi | .................. | 365/205 |
| 2002/0024851 A1 | * | 2/2002 | Kawasumi | ............. | 365/189.08 |

* cited by examiner

Primary Examiner—Long Nguyen
(74) Attorney, Agent, or Firm—Jenkens & Gilchrist, PC

(57) ABSTRACT

A sense amplifier includes a feedback controlled bit line access scheme that feeds a sense amplifier output signal back to control operation of its associated bit line access transistor. This feedback may be implemented using a pair of inverter circuits each coupling a respective output signal to the control gate of the associated access transistor. Alternatively, the feedback may be implement using a logic gate which logically combines the sense amplifier output signals together to generate an output signal for controlling operation of both access transistors. The logic gate is preferably a NAND gate. The sense amplifier further includes a cross-connected feedback inversion circuit which inverts a sense amplifier output signal from a first latch inverter for application to a conducting line of a second latch inverter.

20 Claims, 3 Drawing Sheets

(CONVENTIONAL)

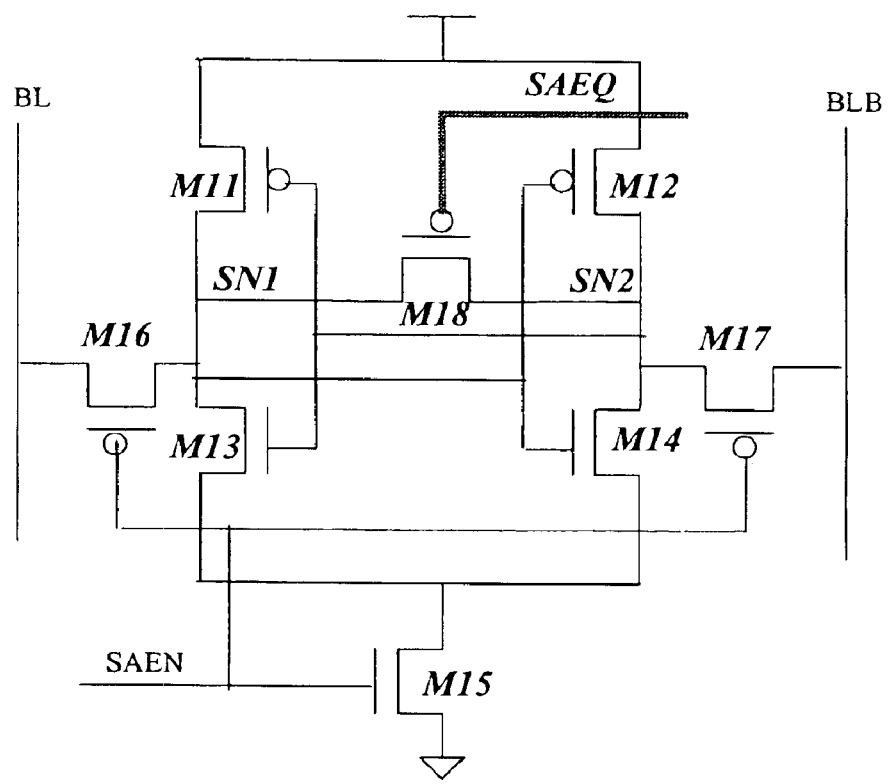
FIG 1
(CONVENTIONAL)

Proposed scheme with inverter feedback

Proposed scheme with NAND feedback

SENSE AMPLIFIER WITH FEEDBACK-CONTROLLED BITLINE ACCESS

PRIORITY CLAIM

The present application claims priority from Indian Application for Patent No. 1039/Del/2002 filed Oct. 16, 2002, the disclosure of which is hereby incorporated by reference.

BACKGROUND OF THE INVENTION

1. Technical Field of the Invention

The present invention relates an improved sense amplifier with feedback-controlled bitline access.

2. Description of Related Art

The sense amplifier circuit shown in FIG. 1 represents a common sense amplifier topology used in SRAM and DRAM cells. The function of a sense amplifier in a DRAM is to amplify the signal and to restore the levels on the bit lines to their full logic levels since the read operation in a one-transistor cell is destructive. In SRAMs, the use of a sense amplifier offers performance enhancements. The sense amplifier can be used to speed up memory access since the bit lines do not have to swing to their full value by discharging through the cell. Additionally, the sense amplifier transistors can be made quite large compared to the cell transistors to drive the bit lines to full logic level quickly.

A sense amplifier amplifies the data signals in either a normal mode or an altered mode. In the normal mode, the data signals must be complementary to each other. Conversely, while in the altered mode, the data signals need not be complementary to each other. In the normal mode, a mode control circuit couples each of the data signals to a respective second input of each sense amplifier so that each sense amplifier receives complimentary data signals at its differential inputs. In the altered mode, the mode control circuit couples a reference voltage to the second inputs of the sense amplifier in the first stage so that each sense amplifiers compares a respective data signal to the reference voltage. Normal mode sense amplifiers are commonly used for high speed SRAM's. Access to the bitline is provided to the evaluating nodes. The sense amplifier enable signal is used for initiating latching operation and disconnecting the bitlines during the evaluation phase.

FIG. 1 shows the schematic circuit diagram of a conventional normal mode latch type sense amplifier. The circuit consists of p-type MOS transistors M11, M12 and n-type MOS transistors M13, M14 connected such that they form a data latch. The data latch is provided with an enabling/disabling MOS transistor M15. When the MOS transistor M15 is enabled, it provides a path to the power supply to complete the circuit.

The data latch is accessed by bitlines BL and BLB through MOS transistors M16 and M17. MOS transistors M15, M16 and M17 are provided with a control signal, sense amplifier enable (SAEN), at their gates such that when the access MOS transistors M16 and M17 are enabled MOS transistor M15 remains disabled and vice versa. Signal nodes SN1 and SN2 are the evaluating nodes of the latch. A MOS transistor M18 is connected between nodes SN1 and SN2 of the latch. The gate of M18 is connected to Sense Amplifier Equalizing (SAEQ) signal. After wordline selection, one of the bitlines discharges through the memory cell. When a sufficient amount of voltage split (difference) is available at the latch evaluating nodes SN1 and SN2, signal SAEN disables access transistors M16 and M17 and thereby disconnects the bitlines from the evaluating nodes, while at the same time enabling transistor M15 provides a ground path for the latching operation.

In a conventional sense amplifier, undesired noise is generated at the sense amplifier nodes when the accessed device is switched off through the sense amplifier enable signal. Also, the input nodes of a conventional sense amplifier are disconnected to the bitlines during the evaluation stage, which disables the additional load on sense amplifier nodes due to charge injection from the bit lines. Noise generated at the sense amplifier nodes delays the evaluation.

SUMMARY OF THE INVENTION

A sense amplifier in accordance with an embodiment of the present invention provides a feedback controlled bit line access scheme which utilizes optimum bit line assistance during the evaluation phase. The feedback ensures automatic control of the amount of bitline assistance taken with the process mismatch present in the sense amplifier (due, for example, to device as well as interconnect capacitance mismatch). Variations due to process mismatch present in the sense-amplifier transistors result in delayed evaluation with corresponding best-case evaluation and worst-case evaluation times. Self-timed operation (feedback controlled access) ensures the overload due to bitline charge injection is optimum for all cases. In case of small mismatch between sense amplifier nodes, the evaluation is fast and the bitline charge injection is small. In the case of large mismatches the evaluation is delayed and the amount of charge injected is large. This arrangement provides reliable operation of sense amplifier.

An inverter feedback is also provided in an embodiment of the invention to further assist the evaluating nodes.

The sense amplifier of the present invention addresses noise issues with respect to the prior art while minimizing the extra load due to bitline charge injection. The sense amplifier obviates undesired noise generation at the sense amplifier nodes by providing a feedback at the bitline and the signal nodes that enables dynamic sampling during evaluation. The sense amplifier further operates faster and in a more reliable manner.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 1 is a schematic circuit diagram of a conventional latch type sense amplifier;

DETAILED DESCRIPTION OF THE DRAWINGS

Figure 2:
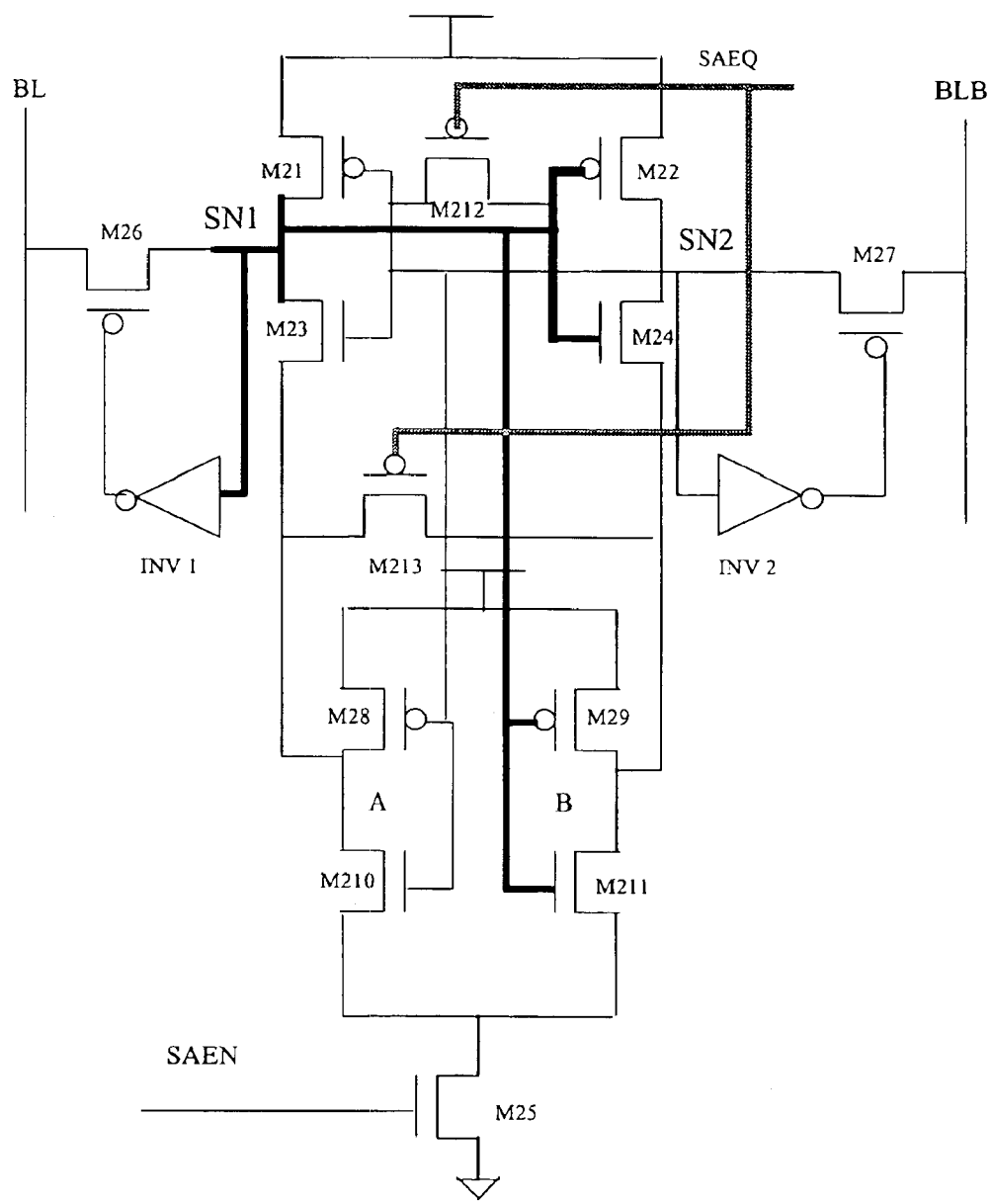
FIG. 2 is a schematic circuit diagram in accordance with an embodiment of the present invention using inverter feedback.

FIG. 2 shows a schematic circuit diagram in accordance with the present invention. PMOS transistors M21, M22 and NMOS transistors M23, M24 form the latch of a sense amplifier. The gates of the equalizing PMOS transistors M212 and M213 are connected to Sense Amplifier Equalize Signal SAEQ. Bitlines BL and BLB are connected through PMOS transistors M26 and M27 to the latch. The gate of the latch-enabling transistor M25 is connected to control signal SAEN. The outputs of inverters INV1, INV2 are fed back to the gates of access transistors M26, M27 from evaluating nodes SN1, SN2 respectively.

As an example, before the start of read operation both the bitlines are precharged to high, sense amplifier nodes SN1 and SN2 are also initially precharged, and access transistors M26 and M27 connect SN1 and SN2 to BL and BLB, respectively. When the wordline of the memory cell is enabled, one of the bitlines, for example, BL, starts discharging through the memory cell and the sense amplifier node SN1 goes low. When the SAEN signal enables nMOS transistor M25, the latching action within the sense amplifier is initiated. As soon as evaluation takes place, feedback from SN1 (going low) through INV1 switches off access transistor M26 and dynamically disconnects the additional load due to charge injection by the bitline. Any undesired noise generation at the sense amplifier nodes is thereby suppressed in the present invention by providing feedback, to enable dynamic sampling during evaluation. Of course, the opposite operation occurs with respect to transistor M27 using feedback through INV2 in the event BLB discharges.

Since this method takes optimum assistance of bitline discharges, it does not introduce any extra overhead on the overall sensing time and hence results in faster sensing.

The present invention utilizes the continuously discharging bitlines during evaluation, accommodating the delay overhead due to bitline charge injection over the relaxation time of generated noise.

A person ordinarily skilled in the art will appreciate that the feedback-controlled access can be realized in many ways. One out of many possible embodiments is the inverter feedback controlled access as discussed above.

The advantage of using inverter feedback is that it provides controlled access as the high going node is continuously connected to the bitline whereas the low going node is disconnected. In this case equalization after the first read is facilitated by bitline thereby enabling quick operation. Further, since the high going node is continuously connected to bitline the pull up PMOS in the latch may be kept small thereby compensating for the area taken by extra circuitry added in the scheme.

The invention also provides for the early switching off of the evaluating NMOS (high going node). The feedback speeds up the evaluation process and also adds to the stability and reliability of the sense-amp. MOS transistors M28, M210 form an inverter A and the MOS transistors M29, M211 form an inverter B. The sources of the NMOS transistors in inverter A and inverter B are connected to the drain of enabling NMOS transistor M25. Nodes SN2 and SN1 are fed as inputs to inverters A and B, respectively. The output of inverter A is connected to the source of NMOS transistor M23, while the output of inverter B is connected to the source of NMOS transistor M24. Inverter B facilitates the discharging of node SN1 and helps in switching off NMOS transistor M24 thereby speeding-up the evaluation process while also improving the stability of the sense amp. Of course, inverter A performs a similar operation with respect to transistor M23 in the even BLB discharges.

The functionalities for feedback controlled access and feedback inversion can be used either separately or in combination with each other in a sense amplifier depending upon requirements and chip area constraints.

Figure 3:
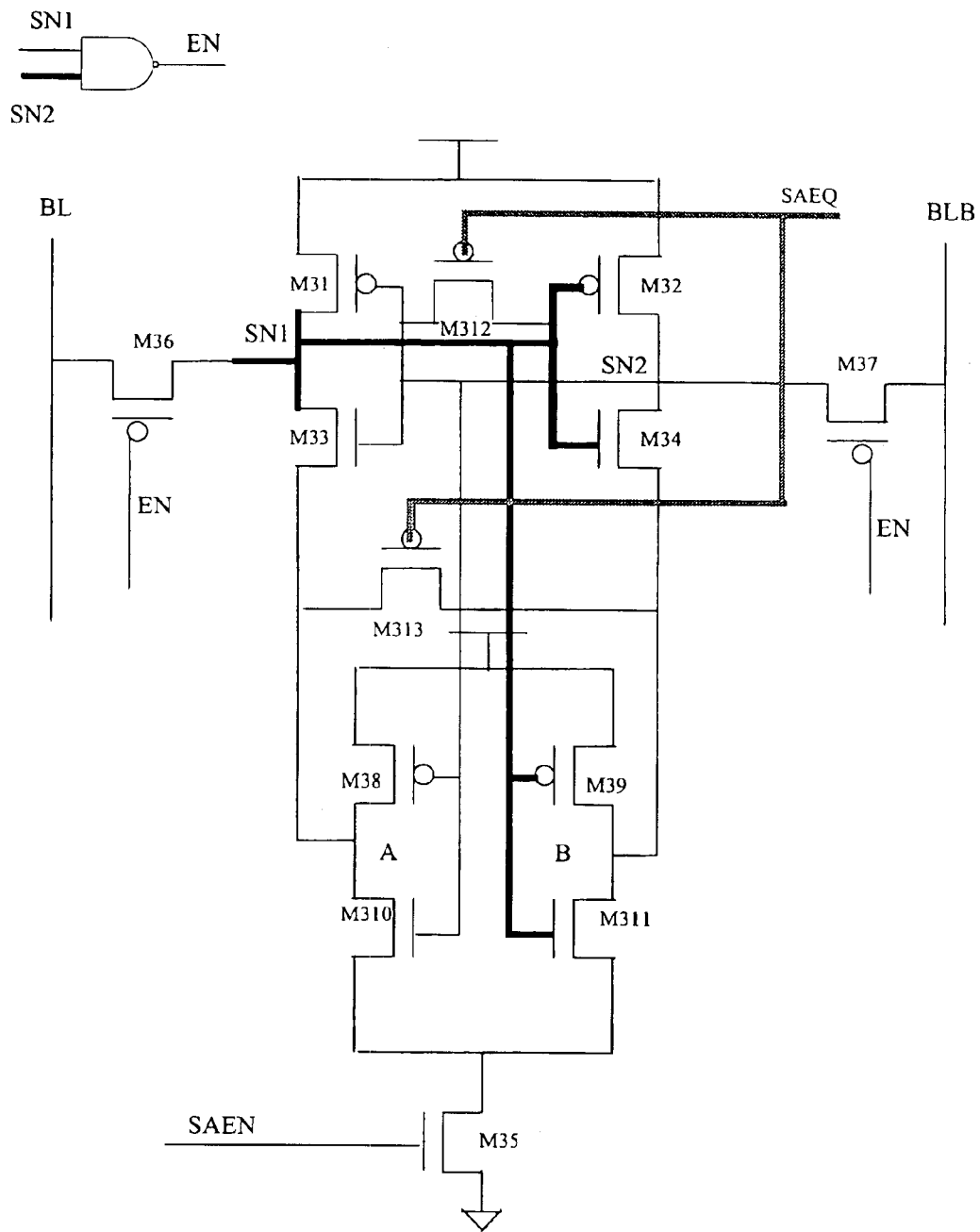
FIG. 3 is a schematic circuit diagram in accordance with an embodiment of the present invention using NAND feedback.

FIG. 3 show a schematic circuit diagram in accordance with another embodiment of the present invention using NAND gate feedback controlled access. The NAND gate feedback controlled access sense amplifier can be easily realized by removing the INV1 and INV2 from the circuit of FIG. 2 and by connecting the gates of the access enabling MOS transistors M36 and M37 to the output of a NAND gate. The inputs of the NAND gate are connected to nodes SN1 and SN2, as shown.

The functionalities for NAND gate feedback controlled access and feedback inversion can be used either separately or in combination with each other in a sense amplifier depending upon requirements and chip area constraints.

In this case a completion signal is generated immediately after the evaluation and may be used as control signal for many purposes, such as wordline disabling.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A sense amplifier, comprising:

cross-coupled inverters forming a latch having access lines, output nodes and conducting lines;

an enabling/disabling circuit connected between a supply terminal and a common conducting terminal;

access control transistors connected between the access lines and the output nodes of the latch;

a first equalizing circuit connected to both output nodes of the latch;

feedback means connected from the output nodes of the latch to control terminals of the access control transistors;

a set of inverters whose outputs are connected to the conducting lines of said latch, and whose inputs are cross-connected to the output nodes of said latch, and whose conducting terminals are connected to the common conducting terminal, and a second equalizing circuit connected to the common conducting lines of the said latch.

2. The sense amplifier as claimed in claim 1 wherein the feedback means comprises a logic gate whose inputs are connected to the output nodes and having an output connected to the control terminals of the access control transistors.

3. The sense amplifier as claimed in claim 1 wherein the enabling/disabling circuit is a MOS transistor.

4. The sense amplifier as claimed in claim 1 wherein the first and second equalizing circuits each include a MOS transister wherein those transistors have their control terminals tied together.

5. The sense amplifier as claimed in claim 1 wherein the feedback means comprises a first inverter connected between a first one of the output nodes of the latch and the control terminal of a first one of said access control transistors and a second inverter connected between a second one of the output nodes of the latch and the control terminal of a second one of said access control transistor.

6. The sense amplifier as claimed in claim 1 wherein the feedback means comprises a NAND gate with inputs connected to the output nodes and an output connected to the control terminals of the access control transistors.

7. A sense amplifier, comprising:

a latch circuit comprised of cross-coupled latch inverters and having a first output and second output;

a first access transistor coupled between the first output of the latch circuit an a first bit line;

a second access transistor coupled between the second output of the latch circuit and a second bit line; and a feedback circuit which couples the first output of the latch circuit to a control terminal of the first access transistor and couples the second output of the latch circuit to a control terminal of the second access transistor.

8. The sense amplifier of claim 7 wherein the feedback circuit comprises:

a first inverter having an input coupled to the first output of the latch circuit and an output coupled to the control terminal of the first access transistor; and a second inverter having an input coupled to the second output of the latch circuit and an output coupled to the control terminal of the second access transistor.

9. The sense amplifier of claim 8 further including:

a third inverter having an input coupled to the second output of the latch circuit and an output coupled to a first conducting line of a first one of the cross-coupled latch inverters; and a fourth inverter having an input coupled to the first output of the latch circuit and an output coupled to a second conducting line of a second one of the cross-coupled latch inverters.

10. The sense amplifier of claim 9 further including:

a first equalizing circuit coupled between the first and second outputs of the latch circuit; and a second equalizing circuit coupled between the first and second conducting lines.

11. The sense amplifier of claim 7 wherein the feedback circuit comprises a logic gate having inputs coupled to the first and second outputs of the latch circuit and an output coupled to the control terminals of the first and second access transistors.

12. The sense amplifier of claim 11 further including:

a fifth inverter having an input coupled to the second output of the latch circuit and an output coupled to a first conducting line of a first one of the cross-coupled latch inverters; and a sixth inverter having an input coupled to the first output of the latch circuit and an output coupled to a second conducting line of a second one of the cross-coupled latch inverters.

13. The sense amplifier of claim 12 further including:

a first equalizing circuit coupled between the first and second outputs of the latch circuit; and a second equalizing circuit coupled between the first and second conducting lines.

14. The sense amplifier of claim 11 wherein the logic gate is a NAND gate.

15. A sense amplifier, comprising:

a latch circuit comprised of cross-coupled first and second latch inverters and having a first output and a second output;

a first inverter having an input coupled to the second output of the latch circuit and an output coupled to a first conducting line of the first latch inverter; and a second inverter having an input coupled to the first output of the latch circuit and an output coupled to a second conducting line of the second latch inverter;

wherein the first and second inverters are not cross-coupled to each other.

16. The sense amplifier of claim 15 further including:

a first equalizing circuit coupled between the first and second outputs of the latch circuit; and a second equalizing circuit coupled between the first and second conducting lines.

17. The sense amplifier of claim 15 further including:

a first access transistor coupled between the first output of the latch circuit an a first bit line;

a second access transistor coupled between the second output of the latch circuit and a second bit line; and a feedback circuit which couples the first output of the latch circuit to a control terminal of the first access transistor and couples the second output of the latch circuit to a control terminal of the second access transistor.

18. The sense amplifier of claim 17 wherein the feedback circuit comprises:

a third inverter having an input coupled to the first output of the latch circuit and an output coupled to the control terminal of the first access transistor; and a fourth inverter having an input coupled to the second output of the latch circuit and an output coupled to the control terminal of the second access transistor.

19. The sense amplifier of claim 17 wherein the feedback circuit comprises a logic gate having inputs coupled to the first and second outputs of the latch circuit and an output coupled to the control terminals of the first and second access transistors.

20. The sense amplifier of claim 19 wherein the logic gate is a NAND gate.

* * * * *

UNITED STATES PATENT AND TRADEMARK OFFICE
CERTIFICATE OF CORRECTION

PATENT NO. : 6,894,541 B2 Page 1 of 1
DATED : May 17, 2005
INVENTOR(S) : Vivek Nautiyal et al.

It is certified that error appears in the above-identified patent and that said Letters Patent is hereby corrected as shown below:

<u>Column 4,</u>
Line 52, replace "MOS Transister" with -- MOS transistor --.
Line 60, replace "access control transistor" with -- access control transistors. --.

Signed and Sealed this

First Day of November, 2005

JON W. DUDAS
*Director of the United States Patent and Trademark Office*